(12) United States Patent
Choi et al.

(10) Patent No.: US 8,907,299 B2
(45) Date of Patent: Dec. 9, 2014

(54) FILM MEMBER, FILM TARGET FOR LASER-DRIVEN ION ACCELERATION, AND MANUFACTURING METHODS THEREOF

(75) Inventors: Il Woo Choi, Gwangju (KR); Jongmin Lee, Gwangju (KR); Chang-Lyoul Lee, Gwangju (KR); KeeHwan Nam, Gwangju (KR); I Jong Kim, Gwangju (KR); Ki Hong Pae, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 406 days.

(21) Appl. No.: 13/325,602

(22) Filed: Dec. 14, 2011

(65) Prior Publication Data

US 2012/0280138 A1 Nov. 8, 2012

(30) Foreign Application Priority Data

May 6, 2011 (KR) .................. 10-2011-0042913

(51) Int. Cl.
| | |
|---|---|
| *H01J 27/24* | (2006.01) |
| *B29C 41/00* | (2006.01) |
| *B29C 41/08* | (2006.01) |
| *B29C 41/12* | (2006.01) |
| *C23C 14/00* | (2006.01) |

(52) U.S. Cl.
CPC .................. *C23C 14/0005* (2013.01)
USPC ....... 250/423 R; 250/424; 438/464; 438/800; 264/298; 264/304; 264/344

(58) Field of Classification Search
USPC ................ 250/423 P, 423 R, 424, 425, 492.1, 250/396 ML, 396 R; 438/409, 454, 459, 464, 438/800, 956; 606/2, 10, 11, 13, 15, 16; 264/298, 299, 304, 309.344, 349

See application file for complete search history.

(56) References Cited

U.S. PATENT DOCUMENTS

| | | | | |
|---|---|---|---|---|
| 4,004,044 | A * | 1/1977 | Franco et al. ............ | 204/192.32 |
| 4,828,964 | A * | 5/1989 | Brunsvold et al. ......... | 430/271.1 |
| 5,793,579 | A * | 8/1998 | Yamamoto et al. ...... | 360/123.19 |
| 8,222,617 | B2 * | 7/2012 | Iseki et al. ................. | 250/492.1 |
| 2002/0127342 | A1 * | 9/2002 | Watanuki et al. ............ | 427/402 |
| 2006/0293644 | A1 * | 12/2006 | Umstadter ...................... | 606/10 |
| 2007/0272653 | A1 * | 11/2007 | Wakita ............................ | 216/13 |

(Continued)

OTHER PUBLICATIONS

Hegelich, B.M. et al., "Laser acceleration of quasi-monoenergetic MeV ion beams," Nature Letters 439, Jan. 2006, p. 441-444.*

(Continued)

*Primary Examiner* — Bernard E Souw
(74) *Attorney, Agent, or Firm* — Nath, Goldberg & Meyer; Joshua B. Goldberg; Katelyn J. Bernier

(57) ABSTRACT

The present disclosure provides a method of manufacturing film member for laser-driven ion acceleration, a film target, and a method of manufacturing the same, so that only the film member exists at a laser focusing point on the film target, allowing repeated ion acceleration from the film member by focusing high power laser beams thereon. The method includes preparing a film member solution containing a film material to be used for laser-driven ion acceleration; forming a film member on a base substrate by using the film member solution; and separating the film member from the base substrate by dipping the base substrate having the film member formed thereon into a film parting solvent.

20 Claims, 8 Drawing Sheets

(56) References Cited

U.S. PATENT DOCUMENTS

| | | | |
|---|---|---|---|
| 2008/0278068 A1* | 11/2008 | Huang et al. | 313/504 |
| 2010/0127183 A1* | 5/2010 | Iseki et al. | 250/396 ML |
| 2010/0137143 A1* | 6/2010 | Rothberg et al. | 506/2 |
| 2013/0087458 A1* | 4/2013 | Mieda et al. | 204/451 |
| 2013/0178689 A1* | 7/2013 | Jung et al. | 600/1 |
| 2013/0261369 A1* | 10/2013 | Jung et al. | 600/1 |

OTHER PUBLICATIONS

Henig, Andreas (2010): "Advanced Approaches to High Intensity Laser-Driven Ion Acceleration." Dissertation, LMU München: Fakultät für Physik.*

A. Maksimchuk et al., "Forward Ion Acceleration in Thin Films Driven by a High Intensity Laser", University of Nebraska—Lincoln, May 1, 2000.*

* cited by examiner

FILM MEMBER, FILM TARGET FOR LASER-DRIVEN ION ACCELERATION, AND MANUFACTURING METHODS THEREOF

CROSS-REFERENCE TO RELATED APPLICATION

This application claims the benefit under 35 U.S.C. §119 of Korean Patent Application No. 10-2011-0042913, filed on May 6, 2011 in the Korean Intellectual Property Office, the entirety of which is incorporated herein by reference.

BACKGROUND

1. Technical Field

The present invention relates to a method of manufacturing a film member and a film target for laser-driven ion acceleration, and methods of manufacturing the same. More particularly, in order to accelerate ions (including protons) by focusing of high power laser beams, a film member which has a thickness ranging from several nanometers to 1 mm is used, and only a film member exists at the laser focusing point on a film target. The present invention also relates to a film target for laser-driven ion acceleration and a method of manufacturing the same, with which alignment of the target with respect to laser may be done by simply shifting either target or laser and/or both on a two-dimensional plane, instead of a complicated alignment process every time, so that ion acceleration from a film member through focusing of laser beams can be repeated several times.

2. Description of the Related Art

When high power laser beams having an output power of several terawatts (trillion watts) are focused on a thin target with a small focal spot, the target is ionized to generate plasma, and electrons in plasma are heated by the laser light, thereby generating high energy electrons.

The high energy electrons are separated from ions in plasma and escape from the target, so that an intense electrostatic field is generated on the target. The intense electrostatic field then accelerates materials constituting the target or ions contained in a contamination layer existing on the surface of the target. Such an ion acceleration process is referred to as laser-driven ion acceleration.

Recent research shows that focusing of laser beams having an output of several hundred terawatts to several petawatts (1000 trillion watts) on a target with a nanometer scale thickness results in generation of protons with a GeV level energy.

Conventionally, a metal (aluminum, gold, silver, or the like) and non-metal (Mylar, polypropylene, or the like) film target having a thickness ranging from several nanometers to several tens of micrometers has been used. However, with such materials, it is difficult to manufacture a film target having a thickness of several nanometers, and such a film target requires a complicated manufacturing process. Moreover, manufacture of a film target having wide area can be difficult according to materials.

BRIEF SUMMARY

The present invention provides a film member manufacturing method capable of easily manufacturing a film member having a thickness ranging from several nanometers to 1 mm.

The present invention also provides a film target used for accelerating ions (including protons) by focusing high power laser beams onto a film member whose thickness ranges from several nanometers to 1 mm, so that only the target member exists at the laser focusing point on the film target.

The present invention also provides a film target for laser-driven ion acceleration and a method of manufacturing the same, which may be aligned with respect to a laser through simply shifting either target or laser and/or both on a two-dimensional plane, instead of a complicated alignment process every time, so that ion acceleration from a film member through focusing of laser beams can be repeated several times.

In accordance with an aspect of the present invention, a method of manufacturing a film member includes: preparing a film member solution containing a film material to be used for laser-driven ion acceleration; forming a film member on a base substrate using the film member solution; and separating the film member from the base substrate by dipping the base substrate having the film member formed thereon into a film parting solvent.

Here, formation of the film member may be carried out by at least one selected from among spin coating, ink-jet printing, doctor blade coating, and spray coating.

Separation of the film member may include floating the film member onto a surface of the film parting solvent.

In accordance with an aspect of the present invention, a method of manufacturing a film member includes: forming a separating medium layer by coating a parting agent on a base substrate; forming a film member to be used for laser-driven ion acceleration on the separating medium layer; and separating the film member from the base substrate by dipping the base substrate into a film parting solvent which selectively dissolves the separating medium.

The parting agent may include at least one selected from among poly(methyl methacrylate) (PMMA), polyvinyl alcohol, PEDOT:PSS, potassium oleate, betaine, and surfactants.

The film parting solvent may be an organic solvent or distilled water.

Further, formation of the film member may be carried out by at least one selected from among thermal evaporation, electron beam evaporation, sputtering, chemical vapor deposition (CVD), spin coating, ink jet printing, doctor blade coating, and spray coating.

In accordance with a further aspect of the present invention, a film target includes a supporting frame having a shape of a flat sheet and having at least one clear through-hole formed through both a light entrance plane and a light exit plane of the supporting frame; and a film member for laser-driven ion acceleration, attached to at least one of the light entrance plane and the light exit plane of the supporting frame, while covering the through-hole.

The supporting frame may have a flatness tolerance of 50 µm or less at the light entrance plane or the light exit plane to which the film member is attached.

The film member may be attached to the supporting frame by adhesives, static electricity, and surface tension, hydrogen bonding or van der Waals force via a liquid medium.

The through-hole may have a uniform cross-sectional area or a cross-sectional area gradually decreasing or increasing from the light exit plane towards the light entrance plane.

It is desirable that the film member may have a height variation of 50 µm or less on the through-hole, with respect to the light entrance plane or the light exit plane.

One of the light entrance plane and the light exit plane in the supporting frame may be divided into plural regions, to which heterogeneous or homogenous film members are respectively attached.

In accordance with yet another aspect of the present invention, a method of manufacturing a film target includes preparing a film member made of one among a metal, non-metal or polymer material and then floating the film member onto a surface of a liquid; and attaching the film member to a supporting frame having a shape of a flat sheet and having at least one through-hole formed through a light entrance plane and a light exit plane of the supporting frame, by means of lifting the film member using the supporting frame from the bottom of the film member.

BRIEF DESCRIPTION OF THE DRAWINGS

The above and other aspects, features, and advantages of the invention will become apparent from the detailed description of the following exemplary embodiments in conjunction with the accompanying drawings.

In preparation of one example of a film target.

DETAILED DESCRIPTION

Figure 1:
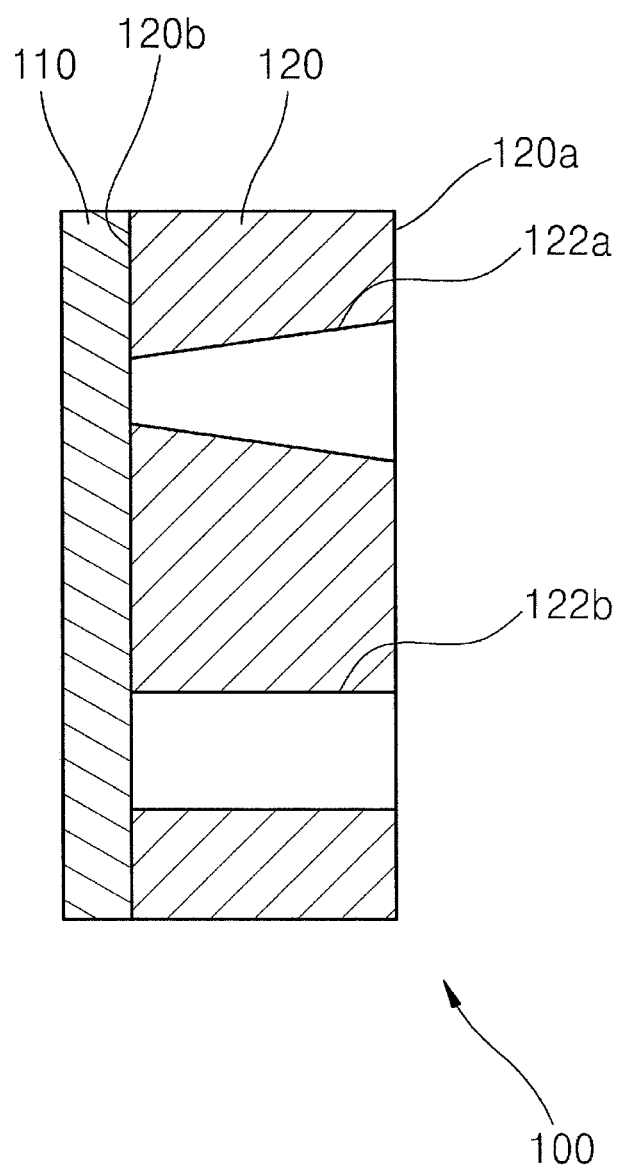
FIG. 1 is a side sectional view of a film target for laser-driven ion acceleration in accordance with one exemplary embodiment of the present invention.

Next, exemplary embodiments of the present invention will be described with reference to the accompanying drawings. It should be understood that the present invention is not limited to the following embodiments and may be embodied in different ways, and that the embodiments are given to provide complete disclosure of the invention and to provide thorough understanding of the invention to those skilled in the art. The scope of the invention is limited by the accompanying claims and equivalents thereof. Like components will be denoted by like reference numerals throughout the specification. Further, description of details apparent to those skilled in the art will be omitted for clarity of description of the present invention.

FIG. 1 is a side sectional view of a film target for laser-driven ion acceleration in accordance with one exemplary embodiment of the present invention.

The film target 100 for laser-driven ion acceleration according to this embodiment includes a film member 110 which has a thickness ranging from several nanometers to 1 mm, and a supporting frame 120 which secures the film member 110 and has a plurality of through-holes 122a, 122b formed at portions thereof at which laser beams will be focused.

In FIG. 1, the film target 100 includes the film member 110 having a thickness ranging from several nanometers to 1 mm, and the supporting frame 120 which secures the film member 110 in a flat state.

The film member 110 may be directly attached to the supporting frame 120 via affinity.

In some embodiments, adhesives (not shown) such as a spray type adhesive may be interposed between the film member 110 and the supporting frame 120.

The supporting frame 120 may be made of a metal, such as aluminum, stainless steel, or the like, or a non-metallic material such as plastic materials. The supporting frame 120 serves to hold the film member 110 and any material may be used for the supporting frame 120 so long as the material may be processed to satisfy desired flatness tolerance.

The supporting frame 120 includes a light entrance plane 120a upon which a laser beam is incident, and a light exit plane 120b through which the laser beam exits. Further, the supporting frame 120 is formed with one or more through-holes 122a, 122b. The through-hole 122a may be formed to have a cross-sectional area gradually decreasing from the light entrance plane 120a towards the light exit plane 120b. Alternatively, the through-hole 122a may be formed to have a cross-sectional area gradually increasing from the light entrance plane 120a towards the light exit plane 120b. Further, the through-hole 122b may be formed to have a constant cross-sectional area.

When the through-hole has a varying cross-sectional area, the film member 110 may be attached to a smaller cross-sectional area side of the through-hole, since flatness of the film member 110 deteriorates with increasing cross-sectional area of the through-hole. Of course, the film member may be attached to a larger cross-sectional area side of the through-hole, as needed.

Such a tapered shape of the through-hole having a varying cross-sectional area allows a large range of incident angles to be secured when a laser beam is irradiated at an angle.

When the film member 110 has a thickness in the range of 1 μm to 1 mm, commercially available metallic, non-metallic or polymeric thin foils or sheets may be used as a material for the film member.

Such a foil or sheet may be made of Al, Au, Ag, Cu, Ni, Ti, Ta, Mo, C, polyethyleneterephthalate (PET), polyester film such as Mylar™, polyethylene, polypropylene, polytetrafluoroethylene such as Teflon™, polyimide, parylene, polycarbonate, and the like. Here, carbon (C) may include graphite, diamond, diamond-like carbon (DLC), and the like.

Since the film member made of the aforementioned material is unlikely to be torn, the film member may be moved by hand or using a tool such as tweezers. Thus, the film member 110 may be attached to the supporting frame 120 via adhesives. A small amount of adhesives such as spray type adhesives is deposited to a portion of the supporting frame 120 and the film member 110 is then flatly attached thereto.

If the film member has a thickness of several nanometers, it is difficult to prepare such a film member 110 having a wide area and to attach, if any, the prepared film member 110 to the supporting frame.

Next, a method of preparing and attaching a film member, having a thickness ranging from several nanometers to 1 mm, to the supporting frame will be described.

Figure 2:
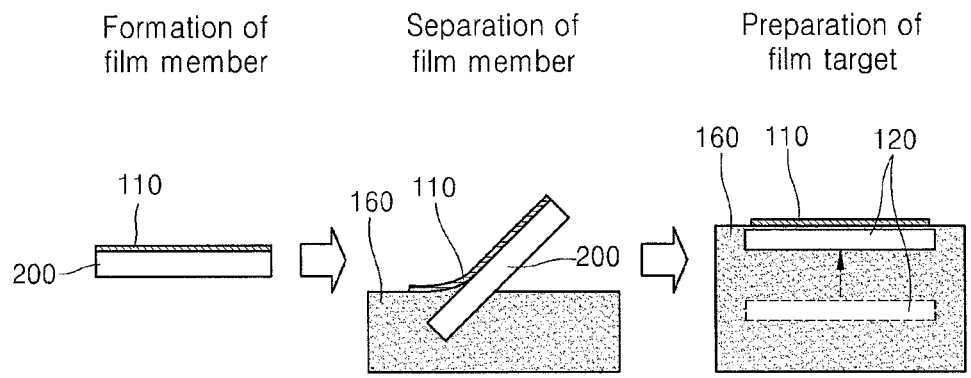
FIG. 2 is a flowchart of a method of manufacturing a film member used for a film target for laser-driven ion acceleration in accordance with one exemplary embodiment of the present invention, when there is no need for a film parting agent.
Figure 3:
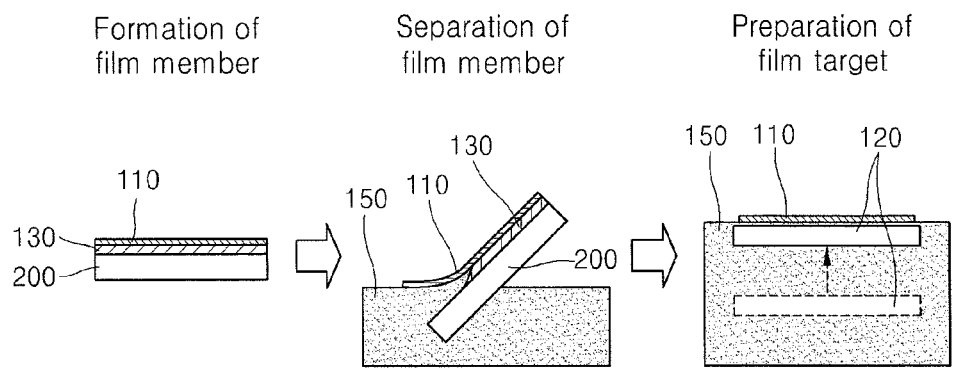
FIG. 3 is a flowchart of a method of manufacturing a film member used for a film target for laser-driven ion acceleration in accordance with another exemplary embodiment of the present invention, when there is a need for a film parting agent.

FIG. 2 is a flowchart of a method of manufacturing a film member used for a film target for laser-driven ion acceleration in accordance with one exemplary embodiment when there is no need for a film parting agent, and FIG. 3 is a flowchart of a method of manufacturing a film member used for a film target for laser-driven ion acceleration in accordance with another exemplary embodiment when there is a need for a film parting agent.

Both FIG. 2 and FIG. 3 show a method of separating a film member 110 from a base substrate 200 using a solvent 150 or 160 after forming the film member 110 on the base substrate 200.

In the method shown in FIG. 2, a film material is directly coated on the base substrate 200 to form the film member 110, followed by separation of the film member 110 from the base substrate 200.

In the method shown in FIG. 3, a parting agent layer 130 is formed on the base substrate 200, and the film member 110 is formed on the parting agent layer 130, which in turn is dissolved to separate the film member 110 from the base substrate 200.

First, the method shown in FIG. 2 will be described.

The film member 110 composed of a film material to be used for laser-driven ion acceleration is formed on the base substrate 200, and is then dipped into a film parting solvent 160 to separate the film member 110 from the base substrate 200 such that the separated film member 110 floats onto the surface of the film parting solvent 160. Then, the film member 110 having a thickness ranging from several nanometers to 1 mm may be attached to the supporting frame 120 by dipping the supporting frame 120 into the film parting solvent 160 and by lifting the film member 110 using the supporting frame 120.

Here, the film member 110 having a thickness ranging from several nanometers to 1 mm may be formed on the base substrate 200 by preparing a film member solution containing the film material to be used for laser-driven ion acceleration, and by coating the solution on the base substrate to form the film member 110. Alternatively, the film member 110 may be formed on the base substrate 200 by thermal evaporation, electron-beam evaporation, sputtering, chemical vapor deposition (CVD), spin coating, ink-jet printing, doctor blade coating, spray coating, and the like.

These methods provide good reproducibility and thickness uniformity in manufacture of the film member. Particularly, the film member may be easily manufactured at low cost by spin coating which does not need vacuum equipment.

The film member may be manufactured to a thickness of 3 nm to 1 mm through each of the methods as described above. Here, it is possible to change the thickness of the film member by adjusting process conditions to be suited to each of the methods. If the thickness of the film member is less than 3 nm, it is difficult not only to handle the film member but also to guarantee uniformity of the film member. A film member having a thickness exceeding 1 mm can be manufactured not only by the coating processes as described above, but also by various other processes which are more advantageous in terms of time and cost than the aforementioned processes.

If the thickness of the film member is several tens of micrometers or more, the film member may be manufactured by other processes instead of the aforementioned coating or deposition processes. Thus, in some embodiments, the film member may have a thickness raging from several nanometers to several tens of micrometers in practice.

By way of one example, a method of manufacturing a film target through spin coating, which facilitates thickness adjustment and may reduce manufacturing costs, will be described in detail.

When a film material is a hydrophobic material, a base substrate 200 having a hydrophilic surface is prepared and distilled water is used as the film parting solvent 160 to separate the film member 110 from the base substrate 200.

In order to form the film member 110 on the base substrate 200, a material for the film member 110 is dissolved in a solvent to prepare a film member solution. Then, the film member solution is dropped in a suitable amount on the base substrate 200, which in turn is rotated at a high speed using a spin coating machine, thereby forming a uniform film member 110.

When the solvent is evaporated from the film member solution to allow only the film member 110 to remain on the substrate, the substrate is slowly dipped from one edge or rim thereof into distilled water provided as the film parting solvent 160. Since the film member 110 is hydrophobic and the base substrate 200 is hydrophilic, the distilled water 160 used as the film parting solvent infiltrates a gap between the base substrate 200 and the film member 110, such that the film member 110 is separated from the base substrate 200 by surface tension.

By this method, the film member 110 is completely separated from the base substrate 200 and floats onto the surface of the distilled water 160.

Then, with the film member 110 floating on the water surface, the supporting frame 120 is dipped into the distilled water below the film member 110, and the film member 110 is lifted by the supporting frame 120, so that the film member 110 may be attached to the surface of the supporting frame 120.

Here, attachment of the film member to the supporting frame 120 may be achieved by affinity.

Herein, the term "affinity" may refer to one of surface tension, hydrogen bonding, and van der Waals force via a liquid medium.

The hydrophobic film material for the film member 110 may be F8BT [poly(9,9'-dioctylfluorene-co-benzothiadiazole)], which is a kind of conjugation polymer. The solvent used for dissolving the film member to prepare the film member solution may be an organic solvent, such as toluene, chlorobenzene, and 1,2 dichlorobenzene, which can easily dissolve a polymer.

Examples of the base substrate 200 may include glass (for example, quartz, crown glass) or silicon wafers, which have high flatness and are commercially available.

The base substrate 200 may have hydrophilic properties or may be treated to have a hydrophilic surface. A variety of attempts may be made to make the base substrate 200 hydrophilic. For example, the base substrate 200 is subjected to ultrasonic cleaning while being sequentially dipped into acetone, methanol, isopropyl alcohol, and the like, followed by oxygen plasma treatment, providing a hydrophilic surface to the base substrate 200.

When the film member 110 is prepared using spin coating, the film member 110 may have a variety of thicknesses through adjustment of the concentration of the film member material in the solvent, and the rotational speed of the spin coating machine. Generally, the thickness of the film member 110 becomes thin with increasing rotational speed of the coating machine and with decreasing concentration of the solution. Relationships between the rotational speed, concentration and thickness are changed according to the kinds of film member 110 and solvent.

Here, preparation of the film member 110 and separation of the film member 110 are not limited to use of the hydrophobic film member and the hydrophilic base substrate. That is, any method may be adopted so long as the method enables separation of the film member 110 from the base substrate 120 through infiltration of the solvent therebetween.

Next, the method shown in FIG. 3 will be described.

In this method, the parting agent layer 130 is formed between the film member 110 and the base substrate 200, and the film member 110 is separated from the base substrate 200 using a film parting solvent 150, which can selectively dissolve the parting agent layer 130.

The method shown in FIG. 3 may be used when it is difficult to form the film member 110 directly on the base substrate 200 or in the case where it is difficult to separate the film member 110 from the base substrate 200.

In consideration of material properties of the film member 110 and the base substrate 200, a suitable parting agent is deposited on the base substrate 200 to form the parting agent layer 130, followed by forming the film member 110 using thermal evaporation, electron-beam evaporation, sputtering, chemical vapor deposition (CVD), spin coating, ink jet printing, doctor blade coating, spray coating, and the like.

Then, the substrate 200 coated with the film member 110 is dipped into the film parting solvent 150 capable of dissolving the parting agent layer 130 to separate the film member 110 from the substrate 200.

Examples of a material for the parting agent layer 130 may include poly(methyl methacrylate) (PMMA), polyvinyl alcohol, PEDOT:PSS, potassium oleate, betaine, surfactant, and the like. Further, examples of the film parting solvent 150 for dissolving the parting agent layer 130 include distilled water or an organic solvent, such as acetone, ethanol, methanol, isopropyl alcohol, and the like The parting agent layer 130 may be formed of any suitable material, which allows the film member 110 to be uniformly formed thereon, and which can be dissolved by the film parting solvent 150, which is used to dissolve the parting agent layer 130 without affecting the film member 110.

The method of attaching the film member 110 to the supporting frame 120 after separating the film member 110 from the base substrate 200 is the same as the method described with reference to FIG. 2, and a repeated description thereof will be omitted.

Figure 4:
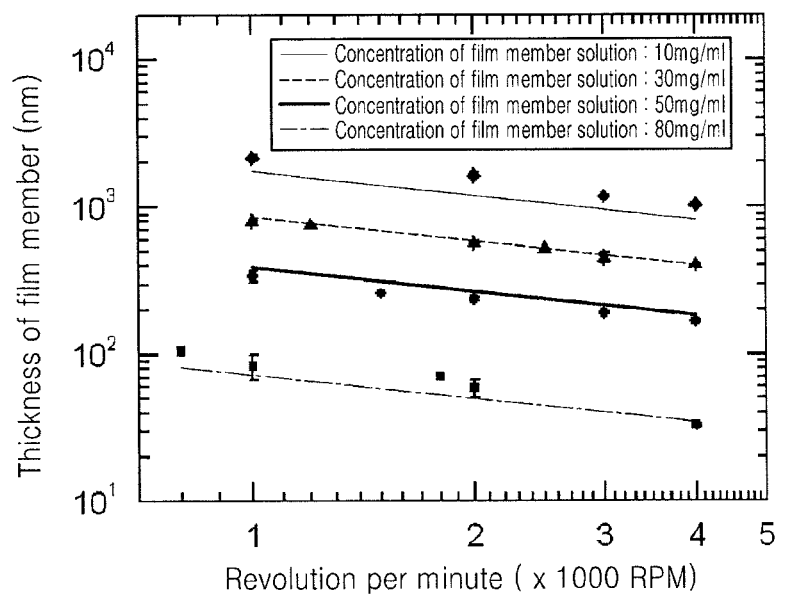
FIG. 4 is a graph depicting thickness of a film member (nanometers, nm) as a function of the rotation speed of a spin coating machine (revolutions per minute, RPM) and concentration of the film member material in its solvent (milligrams per milliliter, mg/ml), when, in accordance with the present invention, F8BT was used as a film material for laser-driven ion acceleration and toluene was used as a solvent for dissolving the film material.
Figure 4:
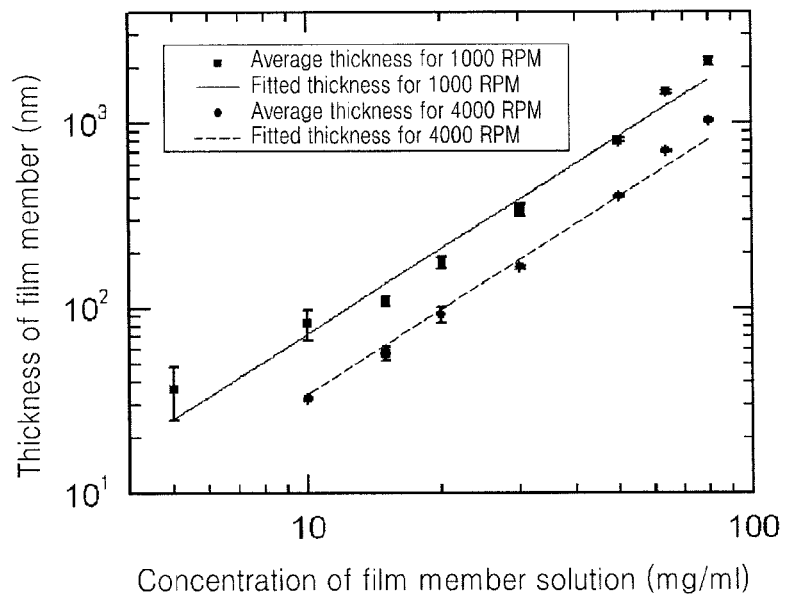

FIG. 4 is a graph depicting thickness of a film member as a function of the rotation speed of a spin coating machine and concentration of a film member solution, when F8BT was used as a film material and toluene was used as a solvent for dissolving the film material in preparation of one example of a film target for laser-driven ion acceleration according to the present invention.

Referring to FIG. 4, there are thicknesses of the film member 110 (unit: nm) which were obtained according to the concentration of the solution (unit: mg/ml) and the revolutions per minute (RPM) of the spin coating machine when F8BT was used as the film member 110 and toluene was used as the solvent.

When using the data shown in FIG. 4, it is possible to manufacture a film member with a desired thickness by adjusting the concentration of the film member solution and the rotation speed of the spin coating machine.

Figure 5:
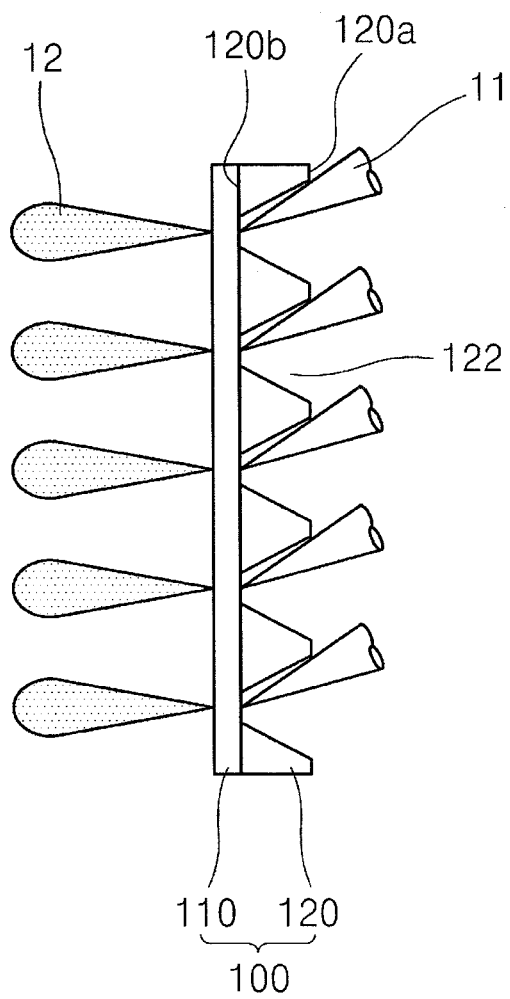
FIG. 5 and FIG. 6 are a cross-sectional view and a plan view of film targets for laser-driven ion acceleration in accordance with exemplary embodiments of the present invention, respectively.

FIG. 5 is a side sectional view of a film target used for laser-driven ion acceleration according to one exemplary embodiment, showing that ions 12 are accelerated from the film member 110 by focusing high power laser beams 11 (hereinafter, also referred to as the "laser") with a small focal spot.

As shown in this figure, the film member 110 is attached to the light entrance plane or light exit plane 120a or 120b of the supporting frame 120. Here, it is important for the light entrance plane or light exit plane 120a or 120b of the supporting frame 120 to have good surface flatness (tolerance of 50 µm or less) without a step. This configuration allows repeated acceleration of ions while moving a focus of the laser 11 or moving the film target 100. Considering optical formation of the focal spot of the laser 11 according to positions, the film member 110 may have a flatness tolerance of 50 µm or less.

Further, the supporting frame 120 is formed with through-holes 122 at portions thereof, into which the laser 11 will be focused. Since only the film member 110 is present on the through-hole into which the laser 11 is irradiated, the through-holes 122 allow the laser 11 or the accelerated ions 12 to freely pass through the film target.

The through-holes 122 may be formed to a much greater size than the size of the laser focus (several micrometers to several tens of micrometers) without affecting flatness of the film member 110 which will located on the corresponding through-hole 122. The through-holes 122 may have a size ranging from several hundred micrometers to several millimeters. Obviously, the size of the through-holes 122 may be decreased or increase, as needed.

Figure 6:
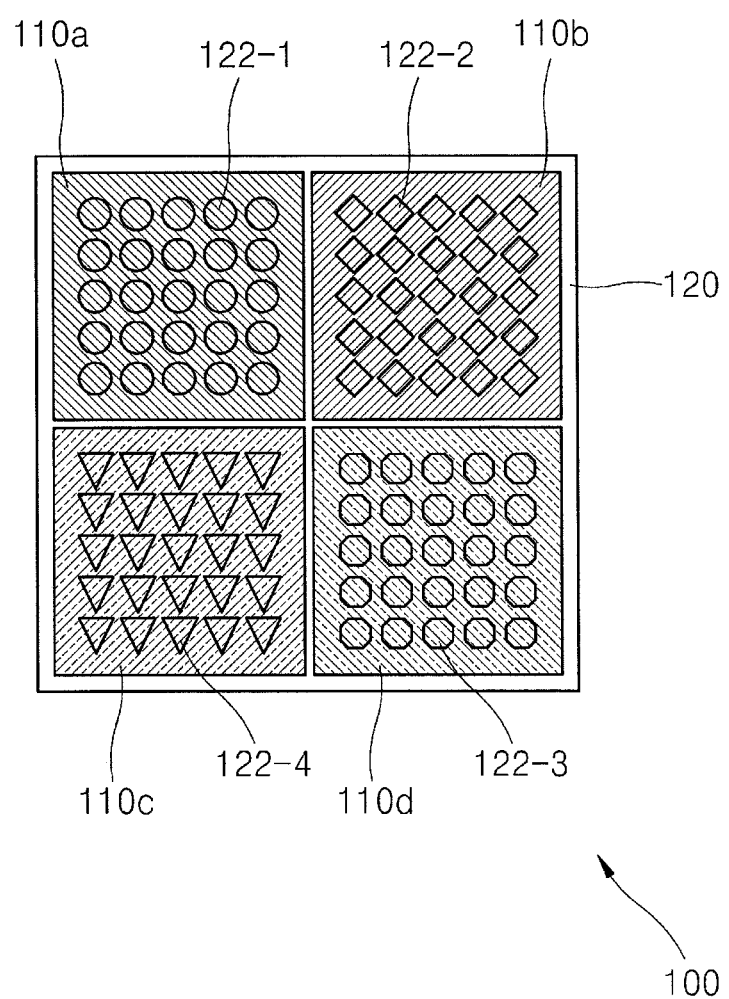

FIG. 6 is a plan view of a film target for laser-driven ion acceleration according to another exemplary embodiment of the invention.

Here, the film target is viewed from a side of the light entrance plane or light exit plane of the supporting frame 120, which is formed with through-holes 122 having various shapes. As shown therein, the through-holes 122 may have a variety of shapes such as a circular shape 122-1, a rhombus shape 122-2, a polygonal shape 122-3, a triangular shape 122-4, and the like.

As shown in FIG. 1 or FIG. 6, the through-holes 122 may have a cross-sectional area decreasing from one side to the other side, as in a truncated conical shape or a truncated pyramidal shape. Alternatively, the through-holes may have a constant cross-sectional area as in a cylindrical shape or a prism shape. Particularly, the truncated conical shape or the truncated pyramidal shape is advantageous when the laser 11 is incident on the film member 110 at an inclined angle instead of a normal angle.

As described above, when the film member 110 attached to the portion of the supporting frame having the through-holes 122 has a flatness tolerance of several micrometers, it is very advantageous for actual ion acceleration experimentation.

As shown in FIG. 5, the through-holes 122 are tapered to have a cross-sectional area gradually decreasing towards the light exit plane, so that the size of the through-holes at the light exit plane 120b is smaller than the size of the through-holes at the light entrance plane 120a. Alternatively, each of the through-holes 122 may be tapered to have a cross-sectional area gradually increasing towards the light exit plane. Here, it is important that the plane of the supporting frame to which the film member 110 will be attached have good surface flatness as described above. Although the film member 110 may be attached to the light entrance plane 120a or the light exit plane 120b, the film member is accurately positioned so as to allow the focus of the laser 11 to be placed on the surface of the film member, as shown in FIG. 5.

As shown in FIG. 5, the accelerated ions 12 are mainly emitted from the opposite side of the film target to the laser entrance side thereof. In FIG. 5, while being present in a propagating direction of the laser 11, the ions 12 are accelerated to high energy along a direction perpendicular to the film member 110 or along a propagation direction of the laser 11. As described above, when the through-holes 122 are formed to have a tapered cross-sectional shape, it is possible to prevent the laser 11 or the ions 12 from being blocked by the through-holes 122 when the laser 11 enters one side of each through-hole 122 and the ions 12 exit from the other side thereof.

As described above, when a single wide film member 110 is attached to the supporting frame to cover the through-holes 122 formed in the supporting frame having good surface flatness (tolerance of 50 µm or less) while covering outer portions of the through-holes 122, the outer portions of the through-holes 122 maintains flatness of the film member 110 attached to the through-holes 122. By this method, all of the film members 110 attached to the corresponding through-holes 122 are coplanar with each other.

As described above, when all of the film members 110 attached to the corresponding through-holes 122 are coplanar with each other, it is possible to perform repeated ion acceleration several times through simple movement of the film target 100 without complicated adjustment of a relative position between the focus of the laser 11 and the film member 110.

When ion acceleration is repeated several times as described above, the position of each of the film members 110 attached to the through-holes 122 becomes coincident with an focal spot of the laser 11 while shifting the film target 100 using a separate target movement device (not shown). After performing ion acceleration once, the film member disappears from the corresponding through-hole 122 and the through-hole becomes empty. Then, for subsequent ion acceleration, the film target 100 is shifted by the target movement device to coincide a location of another through-hole 122 with the focal spot of the laser 11. With this method, it is possible to perform repeated ion acceleration experiments several times while making the location of each of the film members 110 attached to the plurality of through-holes 122 coincident with the focal spots of the laser which remains at the same location during the experimentation.

Further, as shown in FIG. 6, with the supporting frame 120 divided into a plurality of regions, homogeneous or heterogeneous film members 110a, 110b, 110c, 110d may be attached to the respective regions of the support member 120. Here, the homogeneous film members may have the same thickness or different thicknesses.

With the film target 100 manufactured in this manner, it is possible to perform experiments for measuring variation in characteristics of ion generation according to the material species and thickness of the film member 110 through simple movement of the film target 100 as described above.

Figure 7:
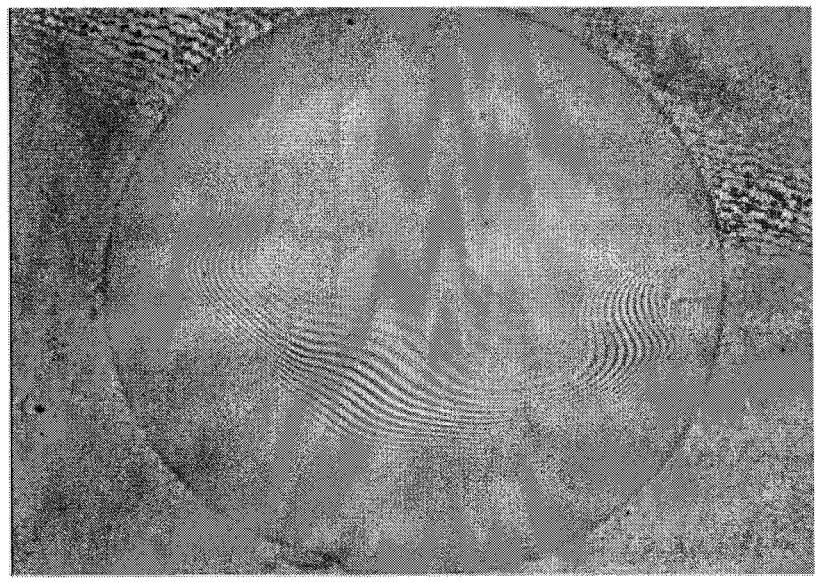
FIG. 7 is a typical picture of an F8BT film target prepared as one example of a film target for laser-driven ion acceleration according to the present invention, and a graph depicting height difference of a film member located between at an outer portion of a through-hole and at an inner portion of the through-hole.
Figure 7:
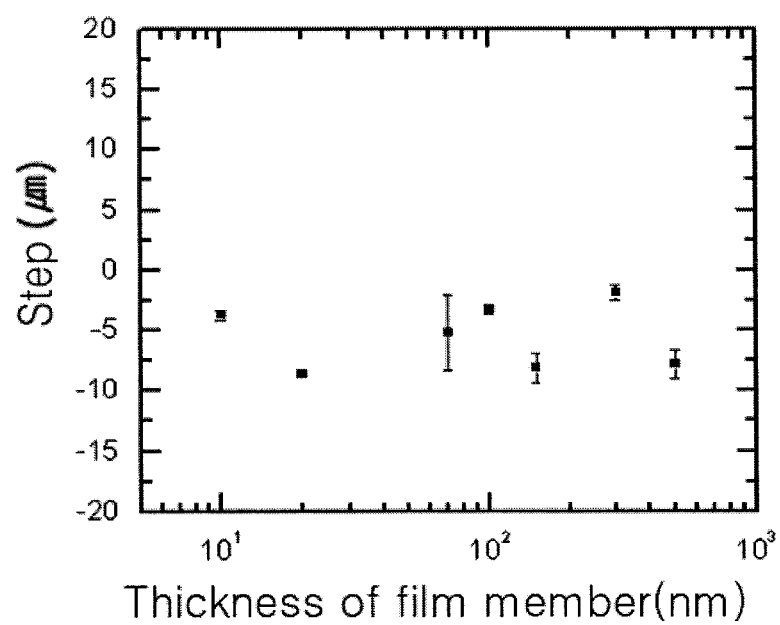

FIG. 7 is a picture of an F8BT film target prepared as one example of a film target for laser-driven ion acceleration according to the present invention, and a graph depicting height difference of a film member between at an outer portion of a through-hole and at an inner portion of the through-hole.

Referring to FIG. 7, the upper part is the picture of the F8BT film target prepared as one example of the film target for laser-driven ion acceleration according to the invention, and the lower part is the graph depicting height difference of the film member between at the outer portion of the through-hole and at the inner portion of the through-hole. Although the film member attached to the through-hole is depressed into the through-hole, the height variance is 10 µm or less.

Since the height difference is much less than the Rayleigh range, which is a distance in which the intensity of focused laser beams is not significantly changed, there is no need for complicated adjustment of a relative position between the focal spot of the laser beams and the film target when focusing the laser beams 11 on the through-holes 11 while moving the film target 100 for laser-driven ion acceleration.

In the example, as shown in FIG. 7, although the height variance is 10 µm or less, a desired height variation of the film member may be 50 µm or less, considering that the Rayleigh range is about 70 µm.

Figure 8:
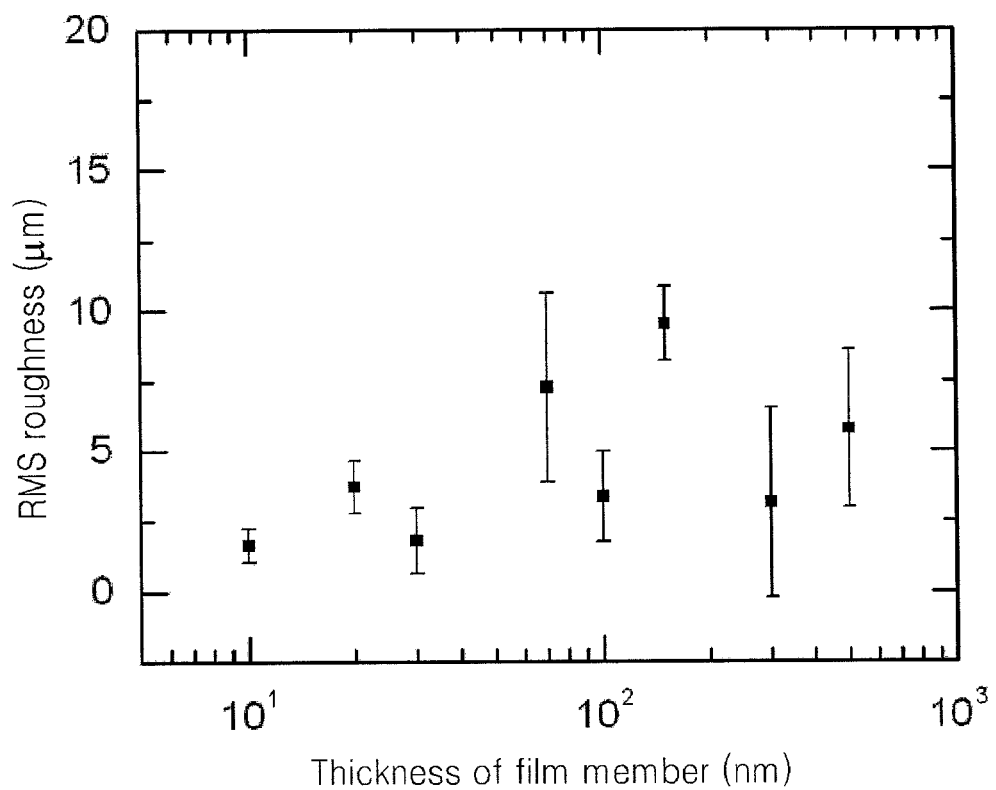
FIG. 8 is a graph depicting surface roughness of a F8BT film member attached at a through-hole in a supporting frame of one example of a film target for laser-driven ion acceleration according to the present invention.

FIG. 8 is a graph depicting surface roughness of an F8BT film member attached to a through-hole of a supporting frame of one example of a film target for laser-driven ion acceleration according to the present invention.

Results shown in FIG. 8 were obtained in units of root-mean-square roughness (RMS roughness) by measuring the surface height of the film member using an instrument having a nanometer scale resolution in height measurement. Although surface roughness of the film member can be changed according to the thickness of the film member, the film member has a surface roughness of 10 nm or less.

Figure 9:
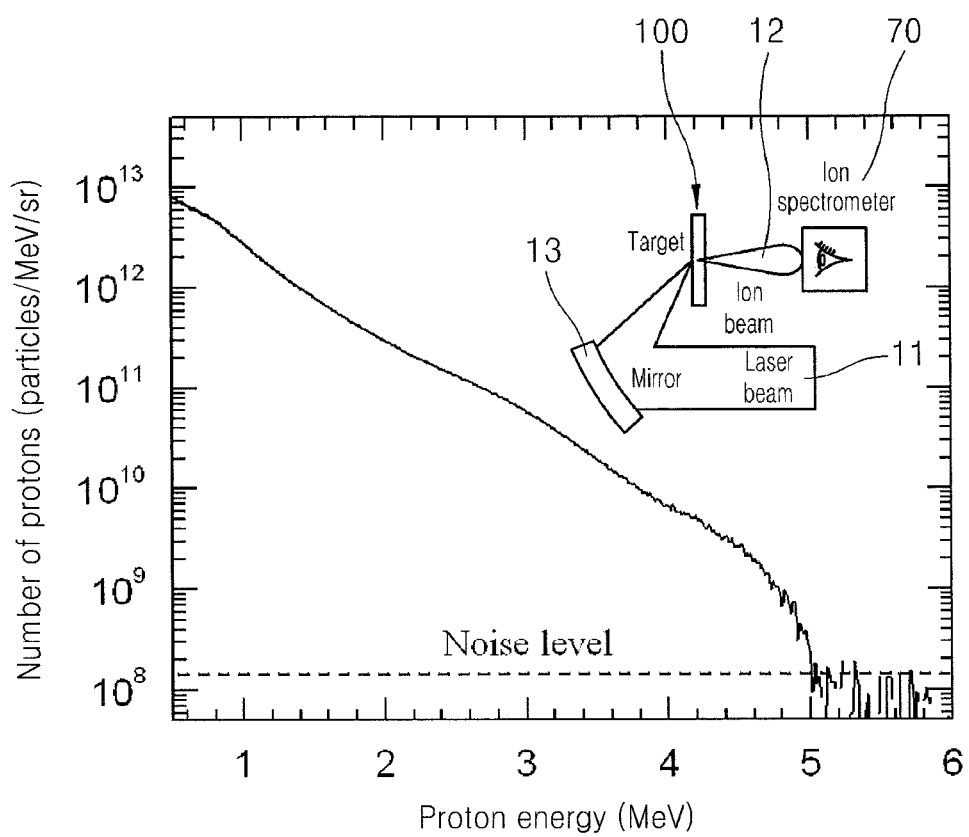
FIG. 9 shows an energy spectrum of protons generated by focusing the laser beams with an intensity of $4\times10^{19}$ W/cm$^2$ onto a 20 nm thick F8BT target prepared as one example of a film target for laser-driven ion acceleration according to the present invention.

FIG. 9 shows energy spectrum of protons generated by focusing laser beams at an intensity of $4 \times 10^{19}$ W/cm$^2$ onto a 20 nm thick F8BT target prepared as one example of the film target for laser-driven ion acceleration according to the present invention. In this example, the laser beams was irradiated with a pulse width of 34 fs ($10^{-15}$ seconds) and an energy of 0.75 J.

As shown in FIG. 9, high energy electrons were generated when laser beams 11 emitted from a high power laser were focused onto a film target 100 by a focusing mirror 13. Then, when the high energy electrons penetrated through a film member, an intense electrostatic field was generated and ionized hydrogen atoms into hydrogen ions (that is, protons), which in turn were accelerated by the electrostatic field, thereby producing high energy protons. Hydrogen atoms constituting F8BT prepared as the film member 110 or hydrogen atoms contained in a contamination layer on the surface of the film member 110 were the origin of hydrogen ions and accelerated to produce high energy protons. Characteristics of ions could be observed using an ion spectrometer 70.

As shown in FIG. 9, high power laser beams were focused to a small focal spot on the film member by a focusing mirror 13. In this example, the focal spot of the laser beams has a full width at half maximum of about 5 µm.

In order to produce protons having as high an energy as possible, the film member 110 may be placed at the focus position of the laser beams. In this example, since the Rayleigh range is about 70 µm, the film member 110 may be placed near the focus position of the laser beams within this Rayleigh range.

On the other hand, experiments may be performed several times while changing characteristics of the laser beams 11 and the film members 110 in order to maximize energy of protons or to obtain protons having desired characteristics.

According to the embodiments of the present invention, the film members attached to the respective through-holes 122 are coplanar with each other. Thus, when focus adjustment of the laser is completed once with respect to a certain film member on a corresponding through-hole, ion acceleration may be carried out repeatedly after simply shifting the film target in a two-dimensional plane instead of complicated readjustment of laser focus with respect to subsequent film members. In other word, it is possible to perform repeated ion acceleration experiments without completed adjustment each time.

Energy spectrum of protons may be measured using a Thomson parabola ion spectrometer, an ion time-of-flight spectrometer, a composite ion spectrometer, and the like.

Referring to FIG. 9, protons obtained from the film member through the irradiation of laser beams have a maximum energy of about 5 MeV, and protons having energies of several tens of MeV to GeV may be produced when using a laser with enhanced power.

In the method of manufacturing a film member for laser-driven ion acceleration, the film target and the method of manufacturing the same according to exemplary embodiments, only a film member having a thickness ranging from several nanometers to 1 mm exists at a laser focusing point on the film target in order to accelerate ions (including protons) through focusing high power laser beams. In addition, the film target is aligned with respect to a laser by simply shifting in a two-dimensional plane instead of a complicated alignment process, so that ion acceleration from a film member through focusing laser beams can be repeated several times. Furthermore, the film member may be used for experiments which require a thin film member to be maintained in a freestanding matter during the experiments.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A method of manufacturing a film member, comprising:
preparing a film member solution containing a film material to be used for laser-driven ion acceleration;
forming a film member on a base substrate by using the film member solution; and
separating the film member from the base substrate by dipping the base substrate having the film member formed thereon into a film parting solvent; and
attaching the film member having a shape of a flat sheet to a supporting frame having a shape of a plane sheet and having a plurality of through-holes formed through a light entrance plane and a light exit plane in the supporting frame.

2. The method of claim 1, wherein the forming a film member is carried out by at least one selected from among spin coating, ink jet printing, doctor blade coating, and spray coating.

3. The method of claim 1, wherein the separating the film member includes floating the film member onto a surface of the film parting solvent.

4. A method of manufacturing a film member, comprising:
forming a parting agent layer by coating a parting agent on a base substrate;
forming a film member to be used for laser-driven ion acceleration on the parting agent layer; and
separating the film member from the base substrate by dipping the base substrate into a film parting solvent which selectively dissolves the parting agent; and
attaching the film member having a shape of a flat sheet to a supporting frame having a shape of a plane sheet and having a plurality of through-holes formed through a light entrance plane and a light exit plane in the supporting frame.

5. The method of claim 4, wherein the parting agent comprises at least one selected from among poly(methyl methacrylate) (PMMA), polyvinyl alcohol, PEDOT:PSS, potassium oleate, betaine, and surfactants.

6. The method of claim 1, wherein the film parting solvent is an organic solvent or distilled water.

7. The method of claim 4, wherein the forming a film member is carried out by at least one selected from among thermal evaporation, electron beam evaporation, sputtering, chemical vapor deposition (CVD), spin coating, ink jet printing, doctor blade coating, and spray coating.

8. The method of claim 1, wherein the film member is a hydrophobic member and the base substrate has a hydrophilic surface.

9. The method of claim 8, wherein the base substrate is at least one of a glass substrate, a silicon substrate, a metal substrate, and a synthetic resin(polymeric) substrate.

10. The method of claim 9, wherein the base substrate is subjected to ultrasonic cleaning using at least one of acetone, methanol and isopropyl alcohol, followed by oxygen plasma treatment to provide the hydrophilic surface to the base substrate.

11. The method of claim 4, wherein the separating the film member includes floating the film member onto a surface of the film parting solvent.

12. A film target comprising:
a supporting frame having a shape of a plane sheet and having a plurality of through-holes formed through a light entrance plane and a light exit plane in the supporting frame; and
a film member for laser-driven ion acceleration attached to at least one of the light entrance plane and the light exit plane in the supporting frame, while covering the through-hole.

13. The film target of claim 12, wherein the supporting frame has a surface flatness tolerance of 50 μm or less on the light entrance plane or the light exit plane to which the film member is attached.

14. The film target of claim 12, wherein the film member is formed by at least one selected from among thermal evaporation, electron beam evaporation, sputtering, chemical vapor deposition (CVD), spin coating, ink jet printing, doctor blade coating, and spray coating, and has a thickness of 3 nm to 1 mm.

15. The film target of claim 12, wherein the film member is made of one material selected from among Al, Au, Ag, Cu, Ni, Ti, Ta, Mo, C, polyethyleneterephthalate (PET), polyester film, polyethylene, polypropylene, polytetrafluoroethylene, polyimide, parylene, and polycarbonate . . . .

16. The film target of claim 12, wherein the film member is made of F8BT [poly(9,9'-dioctylfluorene-co-benzothiadiazole)].

17. The film target of claim 12, wherein the film member is attached to the supporting frame via adhesives or by static electricity, surface tension, hydrogen bonding or van der Waals force via a liquid medium.

18. The film target of claim 12, wherein the through-hole has a circular shape, an elliptical shape or a polygonal shape in a plan view, and has a uniform cross-sectional area or a cross-sectional area gradually decreasing or increasing from the light entrance plane towards the light exit plane.

19. The film target of claim 12, wherein the film member has a height variance of 50 μm or less with respect to the light entrance plane or the light exit plane on the through-hole, to which the film member is attached.

20. The film target of claim 12, wherein the light entrance plane or the light exit plane in the supporting frame is divided into plural regions, to which heterogeneous or homogenous film members are respectively attached.

\* \* \* \* \*